US012320828B2

(12) United States Patent
 Labbe

(10) Patent No.: US 12,320,828 B2
(45) Date of Patent: Jun. 3, 2025

(54) MAGNETIC FIELD DETECTOR MODULE

(71) Applicant: LEM INTERNATIONAL SA, Meyrin (CH)

(72) Inventor: Arnaud Labbe, St. Girod (FR)

(73) Assignee: LEM International SA, Meyrin (CH)

( * ) Notice: Subject to any disclaimer, the term of this patent is extended or adjusted under 35 U.S.C. 154(b) by 0 days.

(21) Appl. No.: 18/841,824

(22) PCT Filed: Feb. 16, 2023

(86) PCT No.: PCT/EP2023/053986
§ 371 (c)(1),
(2) Date: Aug. 27, 2024

(87) PCT Pub. No.: WO2023/161138
PCT Pub. Date: Aug. 31, 2023

(65) Prior Publication Data
US 2025/0110157 A1    Apr. 3, 2025

(30) Foreign Application Priority Data
Feb. 28, 2022 (EP) .................... 22159049

(51) Int. Cl.
 *G01R 15/20* (2006.01)
(52) U.S. Cl.
 CPC ......... *G01R 15/207* (2013.01); *G01R 15/202* (2013.01)
(58) Field of Classification Search
 CPC .................. G01R 15/207; G01R 15/202
(Continued)

(56) References Cited

U.S. PATENT DOCUMENTS

2010/0259248 A1* 10/2010 Labbe ............... G01R 15/207
                                              324/151 R
2016/0327593 A1* 11/2016 Labbe ............... G01R 15/183
2021/0141004 A1*  5/2021 Lanson ............. H10N 52/101

FOREIGN PATENT DOCUMENTS

CN    101903780    12/2010
CN    204116424     1/2015
(Continued)

OTHER PUBLICATIONS

International Search Report and Written Opinion issued by the International Searching Authority, dated Mar. 13, 2023, for International Patent Application No. PCT/EP2023/053986; 12 pages.

*Primary Examiner* — Tung X Nguyen
*Assistant Examiner* — Robert P Alejnikov, Jr.
(74) *Attorney, Agent, or Firm* — Faegre Drinker Biddle & Reath LLP

(57) ABSTRACT

Magnetic field detector module comprising a pair of magnetic field concentrators, an airgap formed between the pair of magnetic field concentrators, a magnetic field sensing cell mounted within the airgap, a plurality of terminals for interconnecting the magnetic field sensing cell to an external circuit, and an insulating housing within which the magnetic field concentrators, magnetic field sensing cell, and the terminals are assembled. The magnetic field detector module further comprises a circuit board on which the magnetic field sensing cell is mounted such that a portion of the circuit board is inserted in the airgap, each terminal having a substantially planar shape cut out of a sheet of metal arranged substantially orthogonally to the circuit board and comprising an internal board connection portion having a pair of opposed contacts separated by a slot, each contact engaging a respective side of the circuit board.

14 Claims, 3 Drawing Sheets

(58) Field of Classification Search
USPC .................................................... 324/117 R
See application file for complete search history.

(56)           References Cited

FOREIGN PATENT DOCUMENTS

EP        3889618       10/2021
EP        4471436 A1 * 12/2024   ........... G01R 15/207

\* cited by examiner

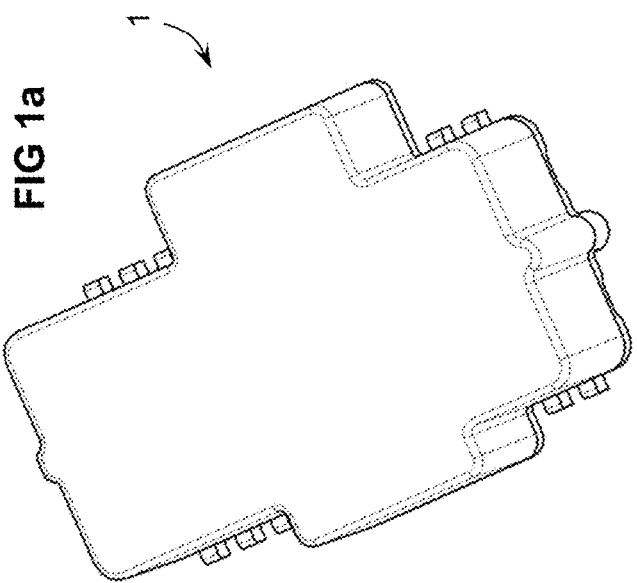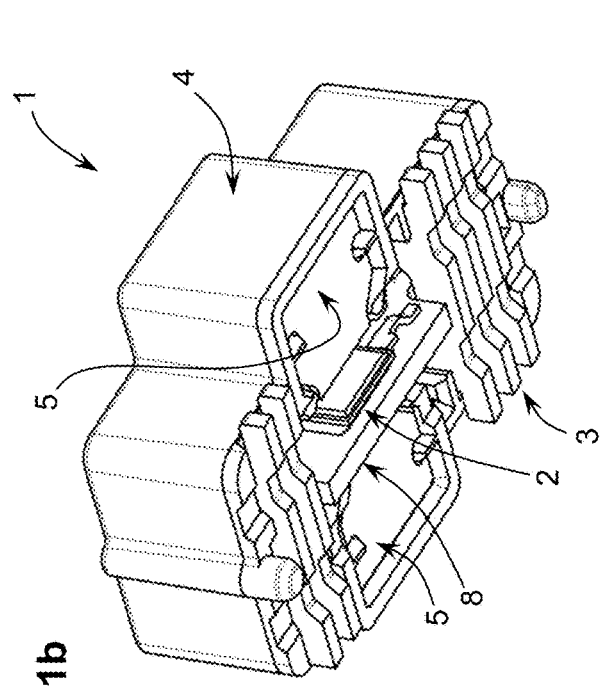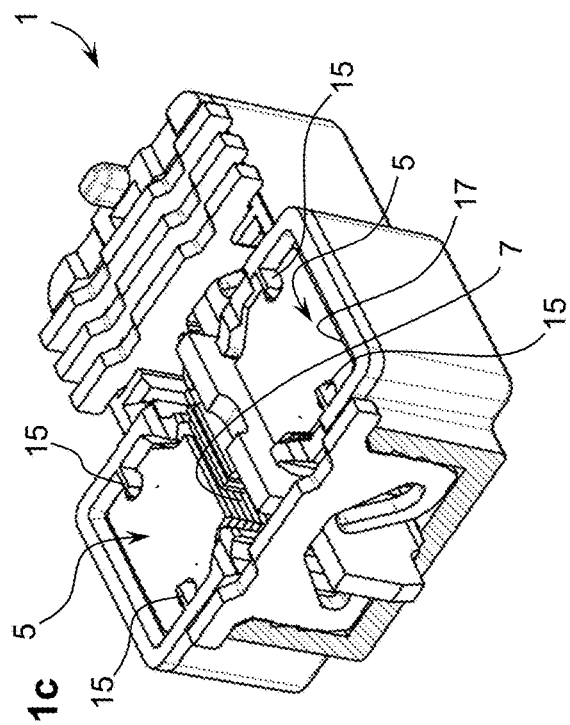

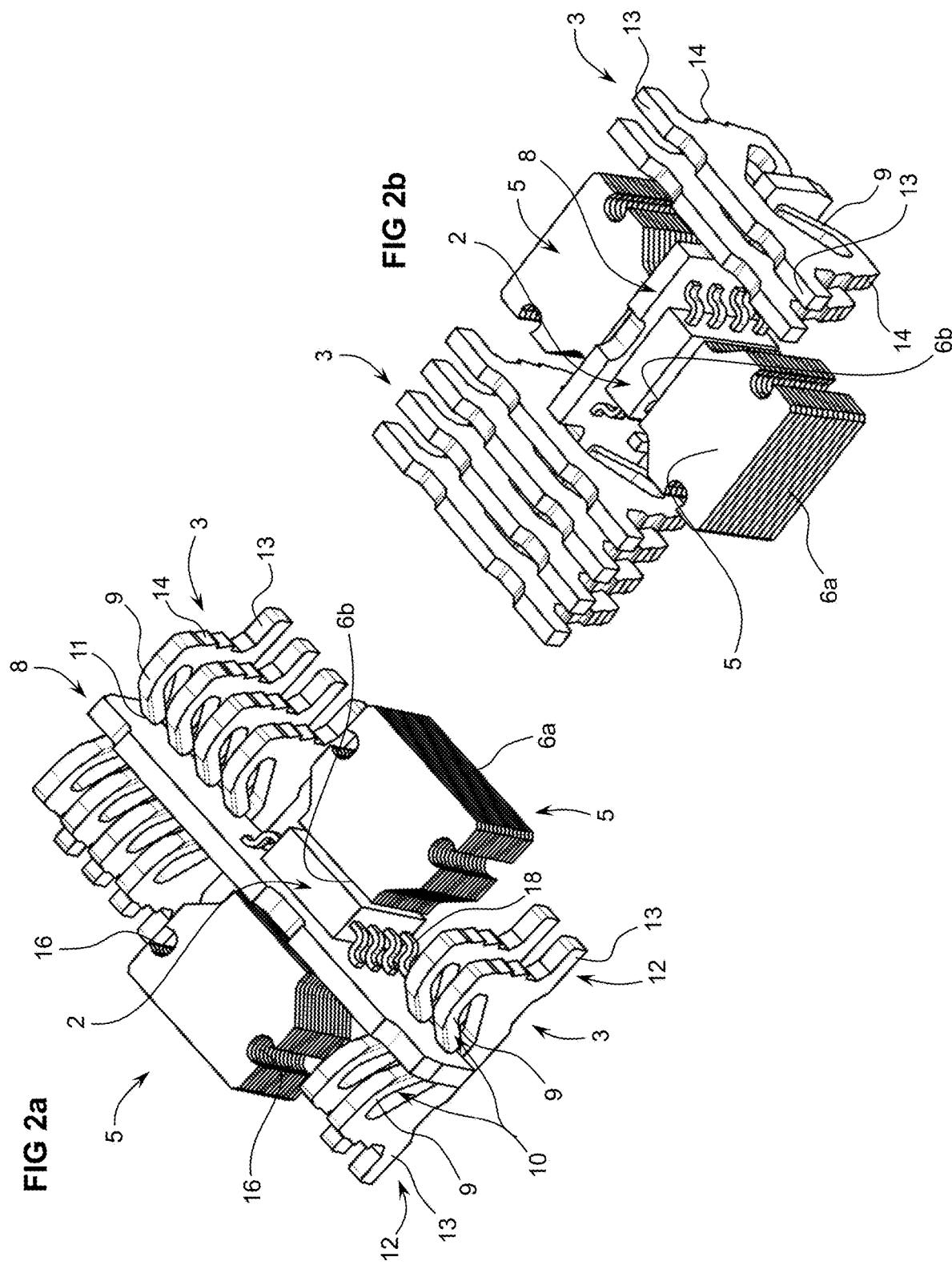

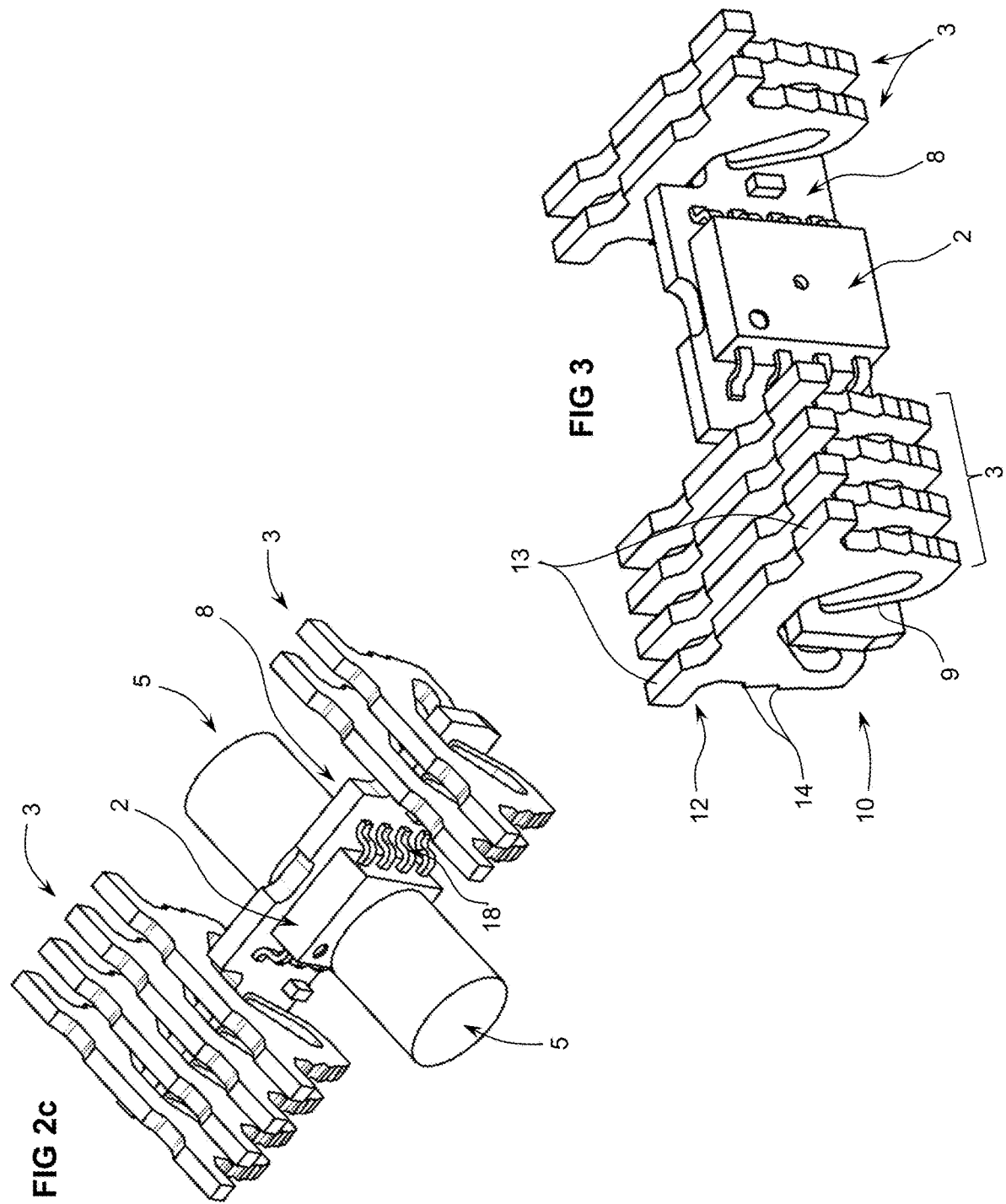

MAGNETIC FIELD DETECTOR MODULE

CROSS-REFERENCE TO RELATED APPLICATIONS

The present application is a national stage entry of International (PCT) Patent Application Number PCT/EP2023/053986, filed Feb. 16, 2023, which claims priority to European Patent Application Number 22159049.0, filed Feb. 28, 2022, the complete disclosures of which are expressly incorporated herein by reference.

The present invention relates to a magnetic field detector module in particular for use in current sensing applications.

A magnetic field detector module for incorporation in a current transducer is described in patent application publication WO2020/157019. In the aforementioned publication, the magnetic field detector module comprises a magnetic field sensing cell in a form of an ASIC positioned in an air gap between magnetic field concentrators overmolded in a dielectric body and presenting contacts for mounting on a circuit board of the current transducer. A U-shaped magnetic core surrounding a central passage through which a primary conductor is inserted is coupled to the magnetic field detector module. Such a magnetic field detector module may however be integrated into systems for measuring a magnetic field, with or without a magnetic core.

Depending on the requirements, such as measurement accuracy, measurement range, durability and environmental conditions in which the magnetic field detector module may be implemented, various magnetic sensing cells and signal processing features of the magnetic field detector module may be required.

Although the magnetic field detector module described in the aforementioned application is durable and reliable, there would be an advantage in increasing the versatility of implementation of the magnetic field detector module taking into account various applications and operating environments.

In view of the foregoing, it is an object of this invention to provide a magnetic field detector module, in particular for use in current sensing applications, that is durable, reliable and versatile, while being cost effective to manufacture and use.

It is advantageous to provide a magnetic field detector module that is accurate and compact.

It is advantageous to provide, in certain applications, a magnetic field detector module that allows some configuration of the module's operating and output characteristics, during installation or in use of the magnetic field detector module.

Objects of this invention have been achieved by providing a magnetic field detector module according to claim 1. Dependent claims set forth various advantageous features of embodiments of the invention.

Disclosed herein is a magnetic field detector module comprising a pair of magnetic field concentrators, an airgap formed between the pair of magnetic field concentrators, a magnetic field sensing cell mounted within the airgap, a plurality of terminals for interconnecting the magnetic field sensing cell to an external circuit, and an insulating housing within which the magnetic field concentrators, magnetic field sensing cell, and the terminals are assembled.

The magnetic field detector module further comprises a circuit board on which the magnetic field sensing cell is mounted such that a portion of the circuit board is inserted in the airgap, each terminal having a substantially planar shape cut out of a sheet of metal arranged substantially orthogonally to the circuit board and comprising an internal board connection portion having a pair of opposed contacts separated by a slot, each contact engaging a respective side of the circuit board.

In an advantageous embodiment, said contacts comprise at least one elastic arm on one side that elastically presses the contacts against the circuit board.

In an advantageous embodiment, the contacts of the terminals are formed in mirror image symmetry.

In an advantageous embodiment, the contacts of each terminal form a tapered entry portion allowing sliding insertion of the terminal over the circuit board such that the circuit board is guided into the slot during assembly of the magnetic field detector module.

In an advantageous embodiment, each terminal comprises fixing portions in a form of barbs on outer edge of the terminal that engage in side surfaces of a cavity formed in the housing.

In an advantageous embodiment, each terminal comprises external board connection portions in a form of surface mount contact contacts arranged in mirror image symmetry about the circuit board.

In an advantageous embodiment, the magnetic field concentrators comprise fixing guides engaging complementary fixing guides in the housing.

In an advantageous embodiment, the fixing guides on the magnetic field concentrators are in a form of keyhole slots within which complementary key rails formed within the housing engage.

In an advantageous embodiment, the magnetic field sensing cell is in the form of an ASIC having electrical terminals in surface mount connection to circuit traces on the circuit board.

In an advantageous embodiment, the magnetic field sensing cell comprises a Hall effect sensor.

In an advantageous embodiment, the terminals are stamped out of sheet metal.

In an advantageous embodiment, the substantially planar terminals are arranged in a juxtaposed parallel manner with respect to each other within the housing, each terminal being inserted into a corresponding slot provided in the housing.

In an advantageous embodiment, the housing comprises a plastic molded part forming a shell forming a cavity therein within which the magnetic field concentrators, the circuit board with sensing cell, and the terminals may all be assembled by insertion in a common axial direction orthogonal to a mounting face of the magnetic field detector module.

In an advantageous embodiment, the current transducer comprising a magnetic core having branches that are positioned adjacent outer ends of the magnetic field concentrators.

Further objects and advantageous features of the invention will be apparent from the claims, from the detailed description, and annexed drawings, in which:

FIGS. 1*a* to 1*c* are perspective views of a magnetic field detector module according to an embodiment of the invention;

FIGS. 2*a* and 2*b* are perspective views of the embodiment of FIGS. 1*a* to 1*c* with a housing removed;

FIG. 2*c* is a perspective view similar to FIG. 2*a* having magnetic concentrators according to a variant;

FIG. 3 is a perspective view of the embodiment of FIG. 2*a* with the magnetic concentrators removed.

Referring to the figures, a magnetic field detector module 1 comprises an insulating housing or body 4, a pair of magnetic field concentrators 5 forming a magnetic field gap 7 (also known commonly as an airgap) therebetween, a magnetic field sensing cell 2 mounted within the airgap 7, a circuit board 8 on which the sensing cell is mounted, and a plurality of terminals 3.

The magnetic field sensing cell 2 may advantageously be in the form of an ASIC (application specific integrated circuit) comprising for instance a Hall effect magnetic field sensor. The sensing cell has terminals 18 connected to conductive circuit traces on the circuit board 8. Further electrical or electronic components may be mounted on the circuit board 8 for power or signal processing and transmission between the sensing cell 2 and terminals 3. Additional electrical or electronic components may be optional depending on the variant.

The circuit board 8 comprises electrically conductive circuit traces that serve to interconnect the sensing cell and any further electrical or electronic components if present on the circuit board, to respective terminals 3 for communication of power and signals between the magnetic field detector module and an external circuit to which the magnetic field detector module is connected.

The magnetic field detector module is in particular configured for mounting and electrical connection to an external circuit board (not shown). In a variant (not shown), the magnetic field detector module may be provided with terminals having plugging portions or other forms of contact portions for plugging connection, clamping connection or other forms of interconnection to an external system.

The magnetic field concentrators 5 may be formed of an FeSi material that may be formed of stamped metal sheets, a plurality being stacked to form a laminated structure. Laminated structures are per se well known in the art of magnetic armatures. The magnetic concentrators may also be made of a ferrite material with a high magnetic permeability, such materials also being per se well known. In embodiments, the magnetic concentrators may have a detector end 6b that has a reduced surface area compared to an outer end 6a, which allows the concentrators to concentrate magnetic flux through the sensing cell 2 positioned in the magnetic field gap 7 while at the same time reducing the risk of saturation in the magnetic core.

In an advantageous embodiment, the magnetic concentrators 5 may advantageously comprise fixing guides, for instance in the form of keyhole slots 16, that allow the concentrators to be inserted into a cavity 17 with complementary guides, for instance key rails 15 formed within the housing 4 to accurately position and anchor the concentrators to the housing in a stable manner.

The housing 4 forms a shell having a cavity 17 accessible from at least one open side. In the illustrated embodiment, the open side is the mounting side of the magnetic field detector module, whereby the magnetic field concentrators 5, the circuit board 8, and the terminals 3 may all be inserted into the housing 4 from a direction orthogonal to the mounting surface. The latter allows for cost effective manufacturing of the magnetic field detector module. An insulating potting material may optionally be filled in the cavity 17 once the components of the module have been assembled in the housing.

The terminals 3 are advantageously formed of planar or substantially planar elements that may in particular be stamped out of sheet metal. The terminals comprise an internal board connection portion 14 and an external board connection portion 12 for electrically interconnecting the circuit traces on the circuit board 8 to circuit traces on an external circuit board (not shown) on to which the magnetic field detector module is intended to be mounted. Each terminal 3 further comprises fixing portions adapted for anchoring the terminals within the housing 4. The fixing portions may advantageously comprise barbs 14 that are adapted to dig into internal side walls of the housing 4 which may for instance be made of an injection molded plastic.

The internal board connection portions 10 may advantageously comprise a pair of opposed contacts 9 forming a slot 11 therebetween into which the circuit board 8 is inserted. The contacts may advantageously be in the form of at least partially elastic contacts, for instance cantilever arm contacts that have a certain elasticity ensuring that the circuit board 8 is clamped between the contacts 9. The contacts 9 of the terminals may advantageously be formed as a pair in mirror image symmetry whereby the terminals may be inserted into the housing after insertion of the circuit board 8 in the housing, the elastic contact arms 9 engaging the circuit board 8 and elastically biasing against contact pads connected to conductive circuit traces on the circuit board for electrically interconnecting the terminals 3 to the magnetic field sensing cell 2.

The substantially planar terminals 3 arranged orthogonally to the circuit board and airgap 7 allow a compact juxtaposed arrangement of the terminals 3 within the housing 4. At the same time this arrangement ensures easy assembly due to the axial insertion of terminals into the housing as well as excellent contact with conductive circuit traces on the circuit board 8 due to the pair of at least partially elastic contacts 9 pressing on opposed sides thereagainst.

Due to the provision of the circuit board 8 to interconnect the terminals 3 to the sensing cell 2, various sensing cell types and configurations may be mounted on the circuit board without requiring a re-design of the terminals 3. Moreover, other electrical or electronic components may be mounted on the circuit board depending on the application and desired configuration.

A temperature sensor may for instance be mounted on the circuit board. One or more electrical shielding layers may also be provided within the circuit board or around the contacts to reduce interference from external electrical fields.

The external board connection portions 12 of the terminals 3 may be configured as surface mount connection feet 13 for solder or weld connection to an external circuit board. In a variant, the external board connection portions 12 may also comprise pin terminals for insertion in through-holes in a circuit board or for pluggable connection to a complementary connector.

The arrangement of terminals, circuit board with magnetic sensing cell mounted thereon, and magnetic field concentrators according to embodiments of the invention also ensures cost effective manufacturing due to the simple assembly by linear single direction insertion of components within the housing and a particularly compact arrangement of juxtaposed planar terminals while at the same time ensuring robust and stable interconnection.

LIST OF REFERENCES USED magnetic field detector module 1
   sensing cell(s) 2
      ASIC (e.g. Hall effect)
      Terminals 18
   Terminals 3
      Internal board connection portion 10
         Elastic arm contacts 9
         Slot 11
      External board connection portion 12

Surface mount connection contacts 13
    (Pin contacts)
Fixing portion
    Barbs 14
insulating housing/body 4
    cavity 17
    magnetic concentrator fixing guides (key rails) 15
magnetic concentrators 5
    outer end 6a
    detector end 6b
    magnetic field gap 7
    fixing guides (slots) 16
circuit board 8

The invention claimed is:

1. Magnetic field detector module comprising a pair of magnetic field concentrators, an airgap formed between the pair of magnetic field concentrators, a magnetic field sensing cell mounted within the airgap, a plurality of terminals for interconnecting the magnetic field sensing cell to an external circuit, and an insulating housing within which the magnetic field concentrators, magnetic field sensing cell, and the terminals are assembled, characterized in that the magnetic field detector module further comprises a circuit board on which the magnetic field sensing cell is mounted such that a portion of the circuit board is inserted in the airgap, each terminal having a substantially planar shape cut out of a sheet of metal arranged substantially orthogonally to the circuit board and comprising an internal board connection portion having a pair of opposed contacts separated by a slot, each contact engaging a respective side of the circuit board.

2. Magnetic field concentrator according to claim 1, wherein said contacts comprise at least one elastic arm on one side that elastically presses the contacts against the circuit board.

3. Magnetic field detector module according to claim 1, wherein the contacts of the terminals are formed in mirror image symmetry.

4. Magnetic field detector module according to claim 1, wherein the contacts of each terminal form a tapered entry portion allowing sliding insertion of the terminal over the circuit board such that the circuit board is guided into the slot during assembly of the magnetic field detector module.

5. Magnetic field detector module according to claim 1, wherein each terminal comprises fixing portions in a form of barbs on outer edge of the terminal that engage in side surfaces of a cavity formed in the housing.

6. Magnetic field detector module according to claim 1, wherein each terminal comprises external board connection portions in a form of surface mount contact contacts arranged in mirror image symmetry about the circuit board.

7. Magnetic field detector module according to claim 1, wherein the magnetic field concentrators comprise fixing guides engaging complementary fixing guides in the housing.

8. Magnetic field detector module according to claim 7, wherein the fixing guides on the magnetic field concentrators are in a form of keyhole slots within which complementary key rails formed within the housing engage.

9. Magnetic field detector module according to claim 1, wherein the magnetic field sensing cell is in the form of an ASIC having electrical terminals in surface mount connection to circuit traces on the circuit board.

10. Magnetic field detector module according to claim 9, wherein the magnetic field sensing cell comprises a Hall effect sensor.

11. Magnetic field detector module according to claim 1, wherein the terminals are stamped out of sheet metal.

12. Magnetic field detector module according to claim 1, wherein the substantially planar terminals are arranged in a juxtaposed parallel manner with respect to each other within the housing, each terminal being inserted into a corresponding slot provided in the housing.

13. Magnetic field detector module according to claim 1, wherein the housing comprises a plastic molded part forming a shell forming a cavity therein within which the magnetic field concentrators, the circuit board with sensing cell, and the terminals may all be assembled by insertion in a common axial direction orthogonal to a mounting face of the magnetic field detector module.

14. Current transducer comprising a magnetic field detector module according to claim 1, the current transducer comprising a magnetic core having branches that are positioned adjacent outer ends of the magnetic field concentrators.

* * * * *